US005134462A

United States Patent [19]
Freyman et al.

[11] Patent Number: 5,134,462
[45] Date of Patent: Jul. 28, 1992

[54] FLEXIBLE FILM CHIP CARRIER HAVING A FLEXIBLE FILM SUBSTRATE AND MEANS FOR MAINTAINING PLANARITY OF THE SUBSTRATE

[75] Inventors: Bruce J. Freyman, Sunrise; Barry M. Miles, Plantation; Jill L. Flaugher, Margate, all of Fla.

[73] Assignee: Motorola, Inc., Schaumburg, Ill.

[21] Appl. No.: 728,822

[22] Filed: Jul. 9, 1991

Related U.S. Application Data

[63] Continuation of Ser. No. 572,575, Aug. 27, 1990, abandoned.

[51] Int. Cl.$^5$ .............................................. H01L 23/02
[52] U.S. Cl. ........................................ 357/74; 357/80; 357/81
[58] Field of Search ........................ 357/74, 80, 81, 70, 357/65

[56] References Cited

U.S. PATENT DOCUMENTS

| | | | |
|---|---|---|---|
| 3,072,832 | 5/1959 | Kilby | 357/80 |
| 3,885,304 | 5/1975 | Kaiser et al. | 357/80 |
| 4,218,701 | 8/1980 | Shirasaki | 357/80 |
| 4,855,867 | 8/1989 | Gazdik et al. | 357/81 |
| 4,953,005 | 8/1990 | Carlson et al. | 357/80 |
| 4,970,579 | 11/1990 | Arldt et al. | 357/81 |

*Primary Examiner*—Andrew J. James
*Assistant Examiner*—T. Davenport
*Attorney, Agent, or Firm*—Daniel K. Nichols; Dale W. Dorinski

[57] ABSTRACT

A flexible film is made into a substrate (100) having metallization patterns. A semiconductor device (106) is affixed to the substrate, and the assembly is heated to expand the substrate. A cover (110) is attached to the substrate, over the device (106). Upon cooling, the substrate (100) shrinks and becomes taut and planar within the reinforced area. Alternatively, a reinforcing ring (210) can be attached to the substrate (200) either before or after attachment of the semiconductor device (206).

24 Claims, 3 Drawing Sheets

FLEXIBLE FILM CHIP CARRIER HAVING A FLEXIBLE FILM SUBSTRATE AND MEANS FOR MAINTAINING PLANARITY OF THE SUBSTRATE

This is a continuation of application Ser. No. 07/572,575, filed Aug. 27, 1990, and now abandoned.

TECHNICAL FIELD

This invention relates generally to a type of electronic device, and more specifically to an integrated circuit package, and most particularly to a low profile, high density leadless chip assembly.

BACKGROUND

The development of high density packaging and circuitry has led to many innovations in the design of integrated circuit packaging. The most common package, the dual in-line package, is well known for lost cost, high reliability, the standardized profile. However, it is also well known for poor packaging density, both laterally and in the vertical direction. Numerous attempts to solve packaging density problems have led to the development of the leadless ceramic chip carrier.

There are many embodiments of the leadless ceramic chip carrier, one of which is the single layer alumina carrier. In this version, alumina ceramic is formed into a substrate with circuitry and interconnecting plated through holes, vias, or castellations. The integrated circuit is then attached to the substrate and wire bonded to the substrate to provide the electrical connections. A cover is placed over the integrated circuit and attached to the substrate using an adhesive to bond the cover to the substrate.

Although this device provides much higher packaging density than the dual in-line package, there arise other functional limitations which need to be overcome in order to provide optimum packaging density and reduced vertical height.

During the manufacture of the alumina substrate, a certain amount of camber or warpage is introduced into the substrate This amount is variable, and cannot be eliminated, even with the most rigorous processing conditions. Excessive camber presents difficulties in wirebonding to the substrate and attachment of the cover to the chip carrier. It follows that these operations would be more successful and reliable if camber or warpage of the substrate were eliminated.

An automatic machine, known as a wirebonder, attaches one end of a very fine gold or aluminum wire to the integrated circuit, and the other end to the substrate, thereby making the electrical connection between the integrated circuit and the substrate. Most wirebonders do not have sophisticated sensing circuitry to sense the vertical location of the substrate, and hence cannot compensate for variations in the level of the substrate surface. When the substrate is warped, the wirebonder will not make a proper bond, because the height of the substrate varies from the programmed location. Attempts to provide the "perfect" substrate have not met with success, and premium substrates are currently supplied by expensive sorting and measuring techniques. This leads to lower yield in the manufacture of substrates, which in turn leads to higher cost substrates.

Another problem with alumina substrates lies in the process for producing the circuitry on the substrate. Industry practice is to screen print a metal-filled ink onto the substrate prior to final substrate firing, and then to co-fire the ceramic and the ink to produce a monolithic unit. During this process, a great deal of shrinkage of the alumina occurs, which is not uniform. To compensate for some of this shrinkage, the tolerance and size of the plated through holes is increased. This restricts the amount of circuitry that can be placed in a given package size. Inherent in the screen printing process is a size limitation on the lines and spaces that can be printed. Typically, 0.008 inch is the smallest line that can be reliably made with the co-fired process, and 0.018 inch is the smallest hole diameter.

Another limitation with single layer alumina assemblies is the thickness of the alumina substrate. Typical substrate thicknesses of 0.025 inch are used, in order to compromise between minimum thickness and maximum durability during assembly of the assembly. If thinner substrates are used, the breakage increases correspondingly, reducing the yield of the finished assembly. Although substrates as thin as 0.010 inches have been used, the cost to manufacture the substrates and the yield loss in assembly of the chip assembly is such that only the most exotic and expensive circuits warrant this treatment.

Excessive camber and warpage also leads to problems in the attachment of the covers. If the substrate is not flat, the cover will not seal properly, resulting in a leaking package. This is not acceptable, since the purpose of the cover is to exclude environmental contamination, and an improper seal will not perform that function. Poor sealing of covers results in yield loss during assembly of the chip assembly, again increasing the final cost of the package.

Integrated circuit packages have been made using thin laminates of glass reinforced epoxy substrates, but while accruing the advantage of a thinner substrate, this method results in a substrate that is even more warped than when using alumina. The lower flexural modulus of this substrate produces warped assemblies, creating problems when soldering and attaching the package to the main circuit board. One method of dealing with excessive warpage of the finished package is to place leads on the perimeter of the package, thereby allowing the leads to compensate for warpage or camber. This practice is most readily seen in packages using tape automated bonding, but carries several disadvantages: increased package cost, increased manufacturing cost, and increased package size.

Clearly, a need exists to provide a lower cost, lower profile, higher reliability, higher density chip assembly package.

SUMMARY OF THE INVENTION

Briefly, according to the invention, a flexible film is made into a substrate having metallization patterns. A semiconductor device is affixed to the substrate, and the assembly is heated to expand the substrate. A cover or other reinforcing means is then attached to the substrate, around or over the device. Upon cooling, the substrate shrinks and becomes taut and planar within the reinforced area. Alternatively, a reinforcing ring can be attached to the substrate either before or after attachment of the semiconductor device.

DETAILED DESCRIPTION OF THE PREFERRED EMBODIMENT

Figure 1A:
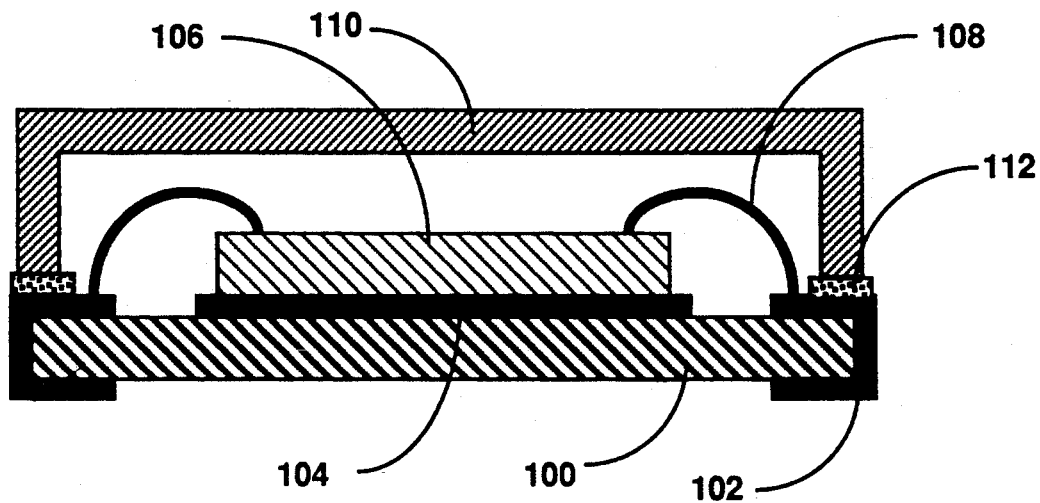
FIG. 1A is a cross section through the center of a leadless chip assembly in the preferred embodiment
Figure 1B:
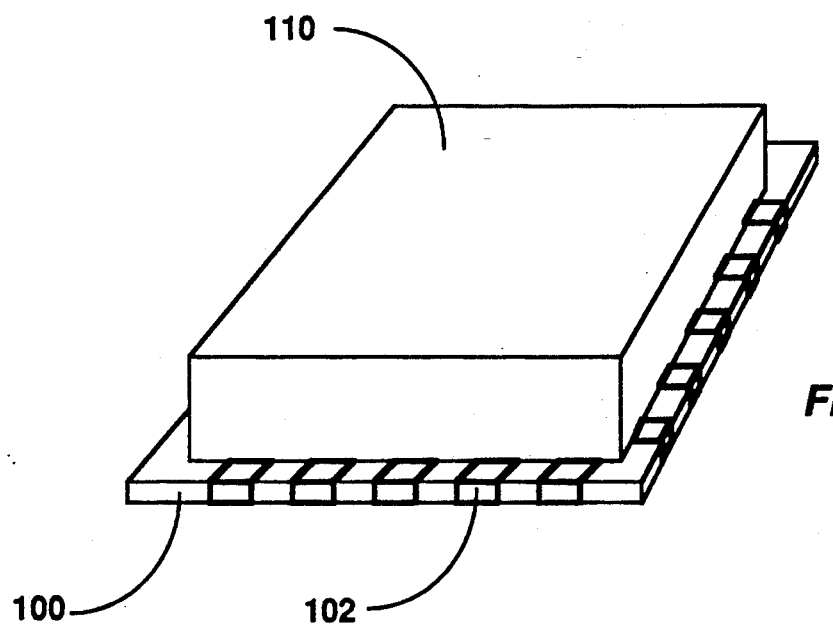
FIG. 1B is an isometric view of the exterior of the chip assembly of FIG. 1A.

Referring to FIGS. 1A and 1B, a flexible film substrate (100) is formed with the appropriate metallization patterns (102 and 104). A number of materials may be employed to fabricate the flexible film, for example, polyimide, polyetherimide, polysulfone, polyester, and polyetheretherketone, with polyimide being the preferred material. Typical film thickness ranges from 0.002 to 0.005 inches. The die pad (104) is a metallized area where a semiconductor device or integrated circuit (106) is mounted, typically by means of a conductive adhesive (not shown). The integrated circuit (106) is electrically attached to the substrate (100) as by means of wires (108) formed between the integrated circuit and the metallization patterns (102 and 104) on the substrate. The methods of wire bonding and attachment of the integrated circuit to the substrate, as well as other attachment methods, are well known to those skilled in the art. The bonded assembly (100, 106, and 108) is then heated so as to expand the substrate (100). When the substrate (100) is heated and expanded, a reinforcing means or cover (110) is placed on the substrate and attached by means of an adhesive (112). Typically, the temperature used to expand the substrate is in excess of that required to cure the adhesive used to attach the reinforcing means. For example, an adhesive such as an epoxy with a cure temperature of 150° C. would require that the substrate be expanded and held at 180° C. prior to addition of the reinforcing means. If the reinforcing means or cover is selected from solderable materials, it can also be attached to the metallized substrate by means of soldering or eutectic bonding.

Figure 2A:
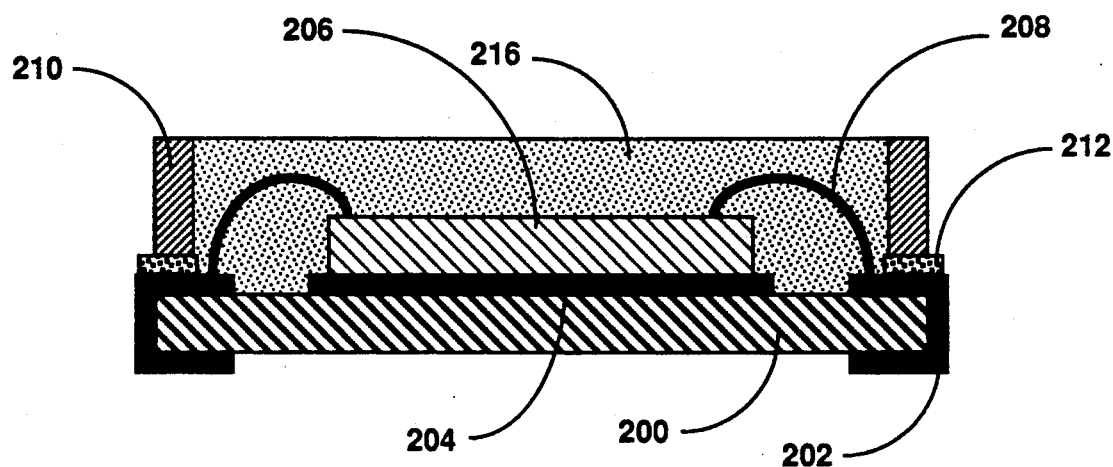
FIG. 2A is a cross section through the center of a leadless chip assembly in an alternate embodiment.
Figure 2B:
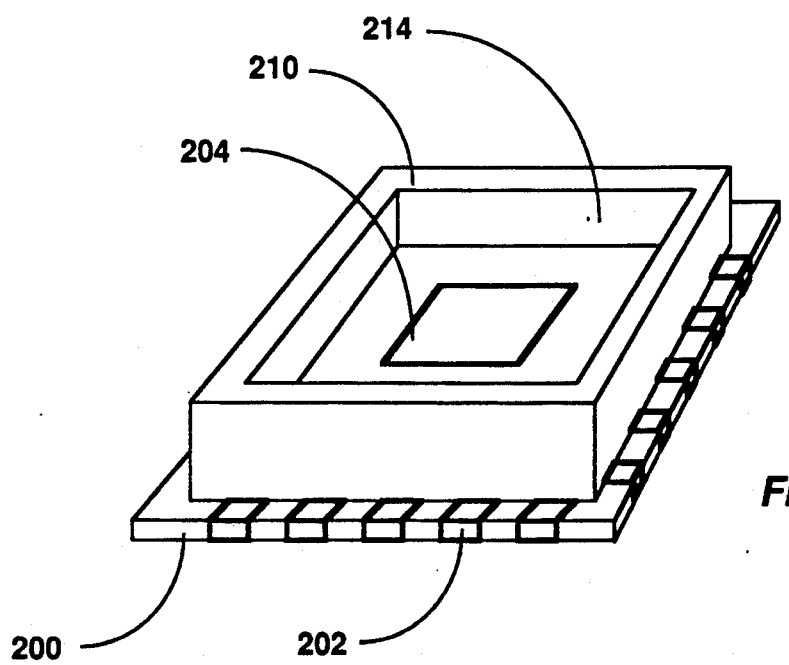
FIG. 2B is an isometric view of the exterior of the chip assembly of FIG. 2A with the encapsulant not shown.

The reinforcing means (110) can be a cover fabricated from for example, alumina ceramic, thermoset polymers, thermoplastic polymers, glass or mineral reinforced thermoset or thermoplastic polymers, or metal, with alumina ceramic being the preferred material. As illustrated in FIGS. 2A and 2B, the reinforcing means can also be a rigid closed member or ring (210) surrounding the perimeter of the integrated circuit (206). The ring (210) can have as few as three sides, or an infinite number or sides (forming a circle), the configuration of the ring being a function of the package type and device size. The ring (210) can be made from the same type of materials as the cover (110), and in addition, it can be made from rigid adhesives, either unfilled or filled with glass or mineral fillers. The main requirements for the reinforcing means, whether it be a cover (110) or a ring (210), is that it be rigid and of a lower thermal coefficient of expansion than the flexible film substrate (100, 200).

After attaching the reinforcing means, the assembly is cooled to ambient temperature. The mismatch between the thermal coefficient of expansion of the substrate and the reinforcing means results in the substrate being stretched taut within the confines of the reinforcing means. This creates a chip carrier package that is perfectly flat and without camber, and is of much lower total height than the conventional packaging.

The reinforcing ring (210) of FIGS. 2A and 2B is affixed to the substrate (200) by means of an adhesive or solder alloy (212). The reinforcing ring (210) is attached in a manner similar to the cover (110). It can also be formed in situ by screen printing an adhesive (210) in the desired shape and position to form the ring. The ring (210) should be printed while the substrate is in the stretched mode. To be most effective, the height of the reinforcing ring should be equal to or greater than the overall height of the integrated circuit and wirebonds. After the assembly is cooled and the substrate is taut, the cavity (214) within the interior of the ring (210) can be filled with an encapsulant or potting material (216), such as a silicone gel or other thermoset polymer, in order to provide environmental protection for the semiconductor device.

Figure 3:
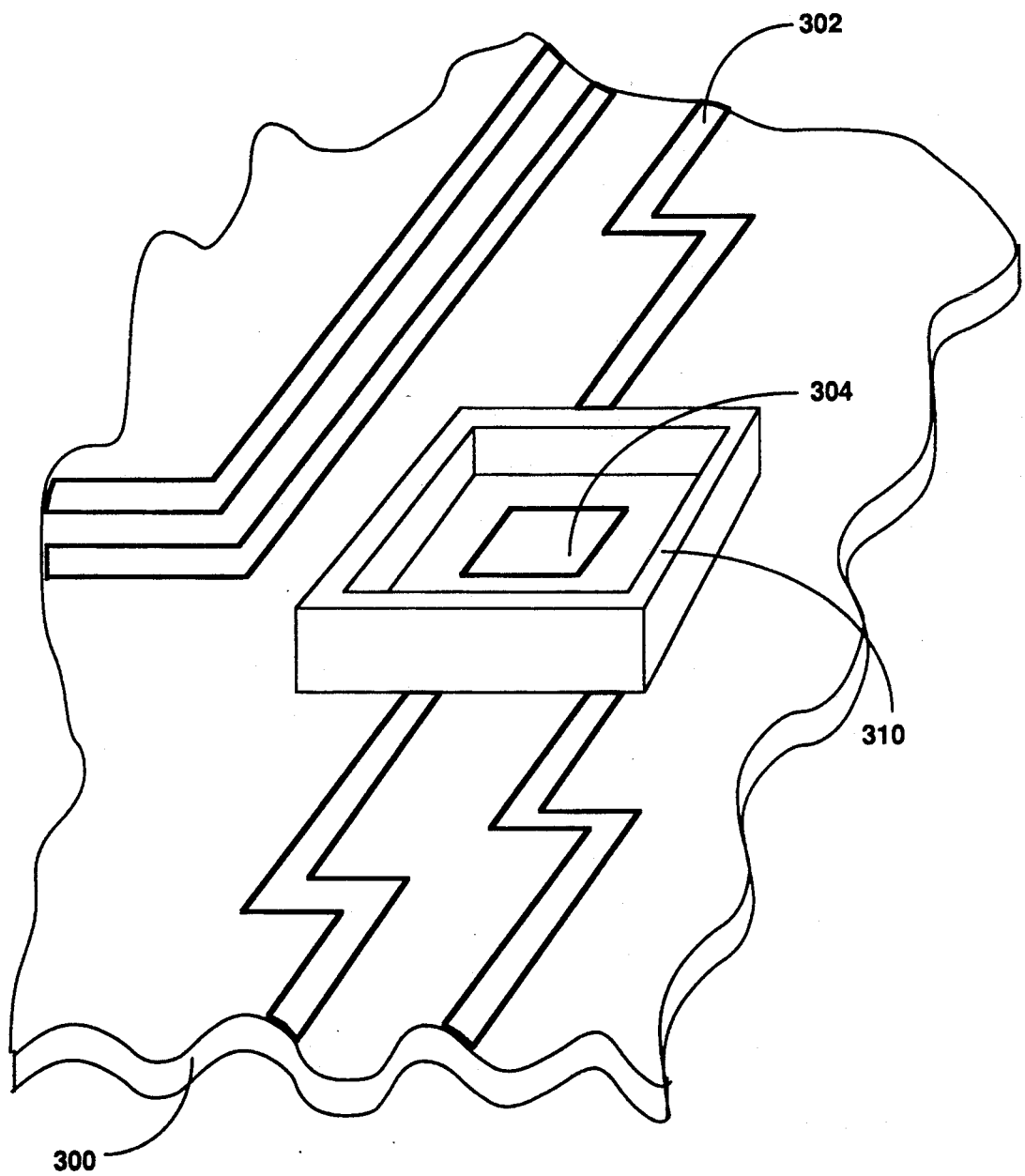
FIG. 3 is an isometric view of the exterior of the chip assembly, with the encapsulant not shown, in another embodiment.

Referring to FIG. 3, another embodiment employs a flexible film substrate (300) containing other circuit metallization (302) and additional discrete components. This method of packaging, known as chip-on-board, embodies the same principles as the previous embodiments, but the chip assembly is now an integral part of the larger substrate (300) rather than a discrete component. Those skilled in the art will understand the application of this principle. A flexible film substrate (300) containing the required metallization patterns (302) is heated and expanded as above, and a reinforcing means (310) in the form of a rigid closed member is attached after the substrate is expanded. Upon cooling to ambient temperature, the film within the reinforcing means is taut and flat, and is now amenable to attachment of the semiconductor device and wirebonds. If desired, an encapsulant may be added as in the previous embodiment.

What is claimed is:

1. A flexible film chip carrier, comprising:
    a flexible film substrate having first and second sides, the first side having a metallization pattern;
    a semiconductor device mechanically attached to the substrate and electrically affixed to the metallization pattern said substrate covering at least an area directly beneath the semiconductor device;
    a substrate reinforcing means attached to the first side of the substrate about the semiconductor device, for maintaining planarity of the substrate.

2. The flexible film chip carrier of claim 1, wherein the substrate is an unreinforced polymer film.

3. The flexible film chip carrier of claim 2, wherein the polymer film is polyimide.

4. The flexible film chip carrier of claim 1, wherein the reinforcing means comprises a rigid closed member.

5. The flexible film chip carrier of claim 4, wherein the rigid closed member is a glass-filled adhesive.

6. The flexible film chip carrier of claim 4, wherein the rigid closed member is a mineral-filled adhesive.

7. The flexible film chip carrier of claim 4, wherein the rigid member is a filled thermoplastic polymer.

8. The flexible film chip carrier of claim 4, wherein the rigid closed member is a thermoset polymer.

9. The flexible film chip carrier of claim 4, wherein the rigid closed member is affixed to the substrate with an adhesive.

10. The flexible film chip carrier of claim 4, wherein the rigid closed member is metal.

11. The flexible film chip carrier of claim 10, wherein the rigid closed member is affixed to the substrate with solder.

12. The flexible film chip carrier of claim 4, wherein the rigid closed member is alumina ceramic.

13. The flexible film chip carrier of claim 4, wherein the volume circumscribed by the rigid closed member is filled with a potting material so as to encapsulate the semiconductor device.

14. The flexible film chip carrier of claim 1, wherein the reinforcing means comprises a cover having a top wall and supporting peripheral side walls, affixed to the substrate so as to form a sealed package about the semiconductor device.

15. The flexible film chip carrier of claim 14, wherein the cover is alumina ceramic.

16. The flexible film chip carrier of claim 15 wherein the polymer film is polyimide.

17. The flexible film chip carrier of claim 15 wherein the cover is affixed to the substrate with a heat curing adhesive.

18. The flexible film chip carrier of claim 14, wherein the cover is metal.

19. The flexible film chip carrier of claim 18, wherein the cover is affixed to the substrate with solder.

20. The flexible film chip carrier of claim 18, wherein the cover is affixed to the substrate with eutectic bonding.

21. The flexible film chip carrier of claim 14, wherein the cover is a thermoplastic or thermoset polymer.

22. The flexible film chip carrier of claim 21 wherein the cover is affixed to the substrate with an adhesive.

23. A flexible film chip carrier, comprising:
 a flexible polyimide film substrate having first and second sides, the first side having a metallization pattern;
 a semiconductor device adhesively bonded directly to the substrate and wire bonded to the metallization pattern;
 a rigid cover having a top wall and supporting peripheral side walls, adhesively bonded to the first side of the substrate about the semiconductor device and wire bonds while the substrate is expanded by heating, for maintaining planarity of the substrate.

24. A flexible film chip carrier prepared by a process comprising:
 providing a flexible film substrate having first and second sides, the first side having a metallization pattern and a semiconductor device mechanically attached to the substrate and electrically connected to the metallization pattern;
 expanding the substrate by heating it, and attaching a reinforcing means to the first side of the substrate about the semiconductor device, for maintaining planarity of the substrate, and contracting the substrate by cooling it.

* * * * *